United States Patent
Kodama

(10) Patent No.: US 12,471,248 B2
(45) Date of Patent: Nov. 11, 2025

(54) COOLING SYSTEM

(71) Applicant: TOYOTA JIDOSHA KABUSHIKI KAISHA, Toyota (JP)

(72) Inventor: Yasuaki Kodama, Seto (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 170 days.

(21) Appl. No.: 18/323,439

(22) Filed: May 25, 2023

(65) Prior Publication Data

US 2024/0032244 A1    Jan. 25, 2024

(30) Foreign Application Priority Data

Jul. 22, 2022   (JP) .................................. 2022-117036

(51) Int. Cl.
*H05K 7/20*       (2006.01)

(52) U.S. Cl.
CPC ................................ *H05K 7/20272* (2013.01)

(58) Field of Classification Search
CPC ............... H05K 7/20272; B60K 11/02; H01M 8/04029; H01M 10/613; H01M 10/625; H01M 10/6567; C09K 5/10
See application file for complete search history.

(56) References Cited

U.S. PATENT DOCUMENTS

| | | | |
|---|---|---|---|
| 4,033,872 A | | 7/1977 | Mori |
| 6,360,559 B1 | * | 3/2002 | Midorikawa ...... H05K 7/20272 |
| | | | 361/689 |
| 7,383,693 B2 | * | 6/2008 | Kawai ..................... F25D 17/02 |
| | | | 62/476 |
| 2017/0112021 A1 | * | 4/2017 | Gradinger ............... F28D 1/022 |

FOREIGN PATENT DOCUMENTS

| | | | |
|---|---|---|---|
| JP | S44-013005 B | | 6/1969 |
| JP | S51060512 U | | 5/1976 |
| JP | 61149220 A | * | 7/1986 |
| JP | 2001050624 A | | 2/2001 |
| JP | 2009127514 A | | 6/2009 |
| JP | 2016097861 A | | 5/2016 |
| JP | 2020089010 A | | 6/2020 |
| WO | 2020137703 A1 | | 7/2020 |

* cited by examiner

*Primary Examiner* — Frantz F Jules
*Assistant Examiner* — Martha Tadesse
(74) *Attorney, Agent, or Firm* — Dickinson Wright, PLLC

(57) ABSTRACT

Provided is a cooling system that has a reduced risk of contaminating the circulation path of the insulating coolant composition with water. The cooling system includes an insulating coolant composition, a circulation path through which the coolant composition circulates, an inlet through which the circulation path communicates with an external space, and a fluorine-based resin filter covering the inlet. The rate at which the coolant composition at 25° C. passes through the filter is greater than $1 \text{ mL·s}^{-1}$. The rate at which water at 25° C. passes through the filter is less than or equal to $8 \times 10^{-5} \text{ mL·s}^{-1}$.

4 Claims, 1 Drawing Sheet

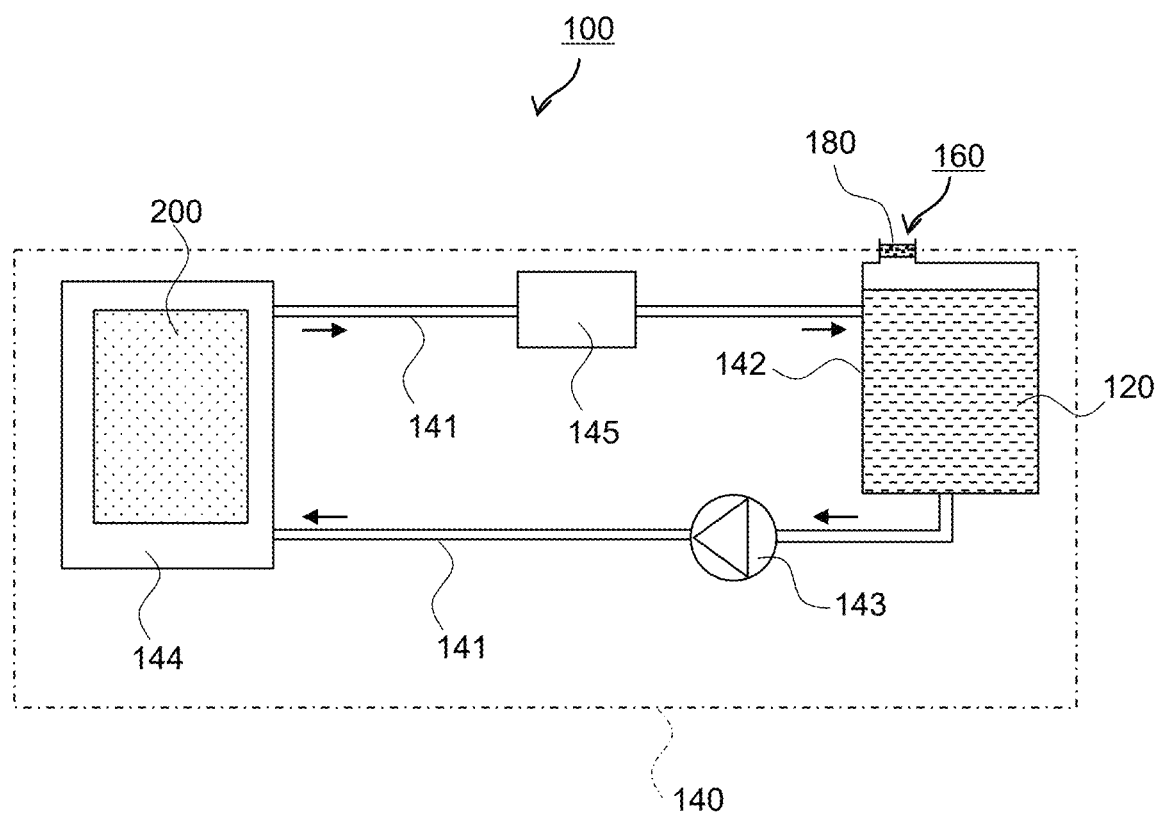

COOLING SYSTEM

CROSS REFERENCE TO RELATED APPLICATIONS

The present application claims priority from Japanese patent application JP 2022-117036 filed on Jul. 22, 2022, the entire content of which is hereby incorporated by reference into this application.

BACKGROUND

Technical Field

The present disclosure generally relates to a cooling system.

Background Art

A vehicle provided with a driving motor such as a hybrid vehicle, a fuel cell vehicle, or an electric vehicle includes a heat generating device such as a motor, a generator, an inverter, a converter, and a battery, and a cooling system for cooling the heat generating device.

In the cooling system, a coolant (cooling liquid) is used. If the coolant leaks due to an accident, the coolant may contact a terminal of the heat generating device to cause a short circuit, which may lead to a secondary disaster. From the viewpoint of reducing the risk of the secondary disaster, it is desirable that the coolant has a high insulating property. Further, bringing the heat generating device into physical contact with the insulating coolant, e.g., immersing the heat generating device in the coolant, allows efficient cooling of the heat generating device.

WO 2020/137703 describes a cooling system with an electrically insulating coolant. JP 2001-050624 A describes a cooling device in which a filter for removing moisture is provided in a coolant circulating circuit.

SUMMARY

The coolant in the cooling system needs to be replaced at an appropriate time. When replacing the coolant, an operator may accidentally load an improper liquid such as water or an aqueous coolant into the cooling system. If the cooling system for use with the insulating coolant is contaminated with water, the insulating property of the coolant may be compromised. The filter provided in the cooling device described in JP 2001-050624 A can remove only a small amount of water, and cannot remove a large amount of water erroneously loaded.

In view of the above, the present disclosure provides a cooling system in which a risk of contaminating a circulation path of an insulating coolant composition with water is reduced.

The present disclosure includes the following aspects.

1. A cooling system comprising:
   an insulating coolant composition;
   a circulation path through which the coolant composition circulates;
   an inlet through which the circulation path communicates with an external space; and
   a fluorine-based resin filter covering the inlet,
   wherein a rate at which the coolant composition at 25° C. passes through the filter is greater than a 1 mL·s$^{-1}$, and a rate at which water at 25° C. passes through the filter is less than or equal to 8×10$^{-5}$ mL·s$^{-1}$.

2. The cooling system according to aspect 1, wherein the filter has a ratio of a mean pore size to a thickness in a range of 0.039 to 0.1.

3. The cooling system according to aspect 1 or 2, wherein the rate at which the coolant composition at 25° C. passes through the filter is greater than 30 mL·s$^{-1}$.

4. The cooling system according to any one of aspects 1 to 3, wherein the filter is made from PTFE, and the coolant composition comprises a paraffin-based mineral oil, a naphthene-based mineral oil, or mixtures thereof.

The cooling system of the present disclosure has a low risk of contaminating the circulation path of the insulating coolant composition with water.

BRIEF DESCRIPTION OF THE DRAWING

FIG. 1 illustrates a cooling system according to an exemplary embodiment.

DETAILED DESCRIPTION

Hereinafter, embodiments of the present disclosure are described. In the present application, the numerical range represented with the term "to" includes the values described before and after the term "to" as a lower limit value and an upper limit value, respectively. The upper limit value and the lower limit value of the numerical range described in the present application can be used alone or in any combination to define a preferable range. In the present application, the terms "comprise" and "contain" mean that an additional component may be included, and encompass "consist essentially of" and "consist of". The term "consist essentially of" means that an additional component having no substantial adverse effect may be included. The term "consisting of" means that only the listed material is included, but does not necessarily exclude additionally including inevitable impurities.

A cooling system according to an embodiment includes an insulating coolant composition, a circulation path through which the coolant composition circulates, an inlet (inlet port) through which the circulation path communicates with an external space, and a filter covering the inlet.

The coolant composition contains an insulating base. In some embodiments, the insulating base is a hydrocarbon-based oil, an ester-based oil, or a mixture thereof. Examples of the hydrocarbon-based oil include mineral oils, hydrocarbon-based synthetic oils, and mixtures thereof. Examples of the mineral oils include paraffin-based mineral oils, naphthene-based mineral oils, and mixtures thereof. The content of the insulating base in the coolant composition is, for example, 10% to 100% by mass, 30% to 99% by mass in some embodiments, 50% to 99% by mass in some embodiments, and 70% to 99% by mass in some embodiments.

The coolant composition may further comprise an additive such as a flame retardant, an antioxidant, a rust inhibitor, a friction modifier, a corrosion inhibitor, a viscosity index improver, a pour point depressant, a dispersant, a surfactant, an anti-wear agent, and a solid lubricant. The content of the additive in the coolant composition is, for example, 0.1% to 20% by mass, 0.2% to 10% by mass in some embodiments, 0.4% to 5% by mass in some embodiments, and 0.5% to 1% by mass in some embodiments.

The coolant composition is substantially free of water. In the present application, "substantially free of water" means not including water in an amount that lowers the insulating property of the coolant composition to such an extent that a short circuit of a device to be cooled may be caused, and means that the content of water in the coolant composition is 1.0% by mass or less in some embodiments, the content of water in the coolant composition is by mass or less in some embodiments, the content of water in the coolant composition is by mass or less in some embodiments, and the content of water in the coolant composition is 0% by mass (undetectable) in some embodiments.

The conductivity of the coolant composition at 20° C. is, for example, 0.1 µS/cm or less, 0.01 µS/cm or less in some embodiments, and 0.001 µS/cm or less in some embodiments.

The kinematic viscosity of the coolant composition at 20° C. is, for example, from 0.1 mm$^2$/s to 100 mm$^2$/s, and from 0.1 mm$^2$/s to 10 mm$^2$/s in some embodiments.

The circulation path through which the coolant composition circulates includes, for example, a pipe, a reserve tank, one or more circulation units that circulate the coolant composition, one or more heat dissipation units that reduce the temperature of the coolant composition, and one or more heat absorption units that cause the coolant composition to absorb heat from a heat generating device. An example of the circulation units is an electric pump. Examples of the heat dissipation units include radiators, chillers, and oil coolers. Examples of the heat generating device include motors, generators, inverters, converters, and batteries. The heat generating device may be partially or completely immersed in the coolant composition.

In a cooling system according to an embodiment, the coolant composition is pumped from the reserve tank by the electric pump, then absorbs heat from the heat generating device at the heat absorption unit, and then dissipates heat at the heat dissipation unit in the downstream of the heat absorption unit, and returns to the reserve tank.

The circulation path communicates with the external space through the inlet. For example, the reserve tank may communicate with the external space through the inlet. The inlet is covered with a filter. Thus, the circulation path communicates with the external space via the filter. When the coolant composition is provided to the inlet, the coolant composition passes through the filter and is loaded to the circulation path. This allows the coolant composition to be supplied or replenished to the cooling system. The inlet may be opened and closed with a cap or the like.

The filter is made from a fluorine-based resin. Examples of the fluorine-based resin include polytetrafluoroethylene (PTFE), perfluoroalkoxy alkane (PFA), perfluoroethylene propene copolymer (FEP), polyvinylidene fluoride (PVDF), polychlorotrifluoroethylene (PCTFE), and ethylene chlorotrifluoroethylene copolymer (ECTFE).

In one embodiment, the filter is made from PTFE, and the coolant composition contains a paraffin-based mineral oil, a naphthene-based mineral oil, or mixtures thereof.

The rate at which the coolant composition at 25° C. passes through the filter, which is herein referred to as permeation rate as appropriate, is greater than 1 mL·s$^{-1}$. This allows an operator to visually recognize lowering of the liquid level of the coolant composition in the funnel when the operator pour the coolant composition into the funnel connected to the inlet to charge the circulation path with the coolant composition. This helps to ensure that the circulation path is charged with a sufficient amount of the coolant composition. The rate at which the coolant composition at 25° C. passes through the filter is greater than 30 mL·s$^{-1}$ in some embodiments. This allows the operator to complete the load of the coolant composition with a sufficiently short waiting time.

The rate at which water at 25° C. passes through the filter is less than or equal to $8 \times 10^{-5}$ mL·s$^{-1}$. It takes more than 10 minutes for a drop of water, the amount of which is about 0.05 mL, to pass through such a filter. This allows preventing or reducing the contamination of the circulation path with water even if the operator erroneously attempts to introduce water or a water-based coolant into the cooling system.

The filter has a ratio of a mean pore size to a thickness in a range of 0.039 to 0.1 in some embodiments, and in a range of 0.08 to 0.12 in some embodiments. The mean pore size of the filter is from 2 µm to 100 µm in some embodiments, from 5 µm to 50 µm in some embodiments, from 8 µm to 40 µm in some embodiments, and from 30 µm to 40 µm in some embodiments. The mean pore size of the filter is measured by the bubble point method (ASTM F316-86, JIS K 3832) with a perm porometer. The thickness of the filter is from 50 µm to 1000 µm in some embodiments, from 100 µm to 800 µm in some embodiments, and from 200 µm to 600 µm in some embodiments. The rate at which the coolant composition at 25° C. passes through the filter is greater than 0.076 mL·cm$^{-2}$·s$^{-1}$ per unit effective filtration area of the filter in some embodiments, and greater than 2.2 mL·cm$^{-2}$·s$^{-1}$ per unit effective filtration area of the filter in some embodiments. When such a filter has an effective filtration area approximately equivalent to the typical opening area of the inlet (e.g., 5 cm 2 to 20 cm 2), the permeation rates of the coolant composition and water as described above can be achieved.

The cooling system according to the embodiment can be incorporated in a vehicle provided with a driving motor. As used herein, the term "vehicle provided with a driving motor" encompasses electric vehicles and fuel cell vehicles that do not include an engine but only include a driving motor as a power source, as well as hybrid vehicles that include both a driving motor and an engine as a power source.

The present disclosure is not limited to the above-described embodiments. Various modifications, additions, and deletions may be made without departing from the spirit or scope of the claims.

EXAMPLES

Hereinafter, the present disclosure will be described in detail with reference to Examples, but the present disclosure is not limited to these Examples.

PTFE filters each having a mean pore size and a thickness as listed in FIG. 1 were prepared. The mean pore size of each of the filters was measured by the bubble point method (ASTM F316-86, JIS K 3832) with a perm porometer.

A cylindrical funnel having an inner diameter of 6 cm and a collection bottle were connected to each other via the filter. The effective filtration area of the filter was 13.2 cm$^2$.

220 mL of a coolant composition was put in the funnel at room temperature (25° C.). Mineral oil was used as the coolant composition. The period of time for the total amount of the coolant composition to pass through the filter was measured. Based on the measured value, the rate (permeation rate) at which the coolant composition passed through the filter was determined. The results are shown in Table 1.

220 mL of water or long-life coolant (LLC) (Toyota genuine Super Long Life Coolant) containing ethylene glycol as a main component was put into the funnel at room temperature (25° C.). After 10 minutes had passed, observation was carried out to determine whether any water or the LLC had passed through the filter. The results are shown in Table 1.

TABLE 1

| | Mean pore size d [μm] | Thickness t [μm] | Ratio d/t [—] | Permeation rate of coolant composition [mL · s$^{-1}$] | Water permeation | permeation LLC |
|---|---|---|---|---|---|---|
| Comparative Example 1 | 6 | 920 | 0.0065 | 0.5 | None | None |
| Comparative Example 2 | 10 | 530 | 0.0189 | 1 | None | None |
| Example 1 | 10 | 255 | 0.0392 | 13 | None | None |
| Example 2 | 35 | 515 | 0.0680 | 17 | None | None |
| Example 3 | 25 | 346 | 0.0723 | 25 | None | None |
| Example 4 | 35 | 350 | 0.1000 | 50 | None | None |
| Comparative Example 3 | 42 | 250 | 0.1680 | 63 | Observed | None |

In each of Examples 1 to 4, the filter had the ratio of the mean pore size to the thickness in the range of 0.0392 to 0.1. The filter also had the mean pore size of 40 μm or less. In each of Examples 1 to 4, the coolant composition passed through the filter at a sufficiently high rate, which was greater than 1 mL·s$^{-1}$, i.e. greater than 0.076 mL·cm$^{-2}$·s$^{-1}$ per unit effective filtration area, and none of water and the LLC passed through the filter. In Example 4, in which the filter had the ratio of the mean pore size to the thickness of 0.1, the coolant composition passed through the filter at a particularly higher rate, which was 50 mL·s$^{-1}$, corresponding to 3.79 mL·cm$^{-2}$·s$^{-1}$ per unit effective filtration area. In Comparative Examples 1 and 2, none of water and the LLC passed through the filter while the permeation rate of the coolant composition was lower. In Comparative Example 3, the permeation rate of the coolant composition was high while water passed through the filter as well. It should be noted that the ratio (d/t) of the mean pore size to the thickness of the filter shown in Table 1 had high correlation with the permeation rate of the coolant composition ($R^2$=0.93).

LIST OF REFERENCE NUMERALS

100 cooling system
120 insulating coolant composition 140 circulation path
141 pipe
142 reserve tank
143 circulation unit
144 heat absorption unit
145 heat dissipation unit
160 inlet
180 fluorine-based resin filter 200 heat generating device

What is claimed is:

1. A cooling system comprising:
   an insulating coolant composition;
   a circulation path through which the insulating coolant composition circulates, wherein the circulation path comprises a pipe and a reserve tank;
   an inlet through which the circulation path communicates with an external space; and
   a fluorine-based resin filter covering the inlet,
   wherein a rate at which the coolant composition at 25° C. passes through the fluorine-based resin filter is greater than a 1 mL·s$^{-1}$, and a rate at which water at 25° C. passes through the filter is less than or equal to 8×10$^{-5}$ mL·s$^{-1}$.

2. The cooling system according to claim 1, wherein the fluorine-based resin filter has a ratio of a mean pore size to a thickness in a range of 0.039 to 0.1.

3. The cooling system according to claim 1, wherein the rate at which the insulating coolant composition at 25° C. passes through the fluorine-based resin filter is greater than 30 mL·s$^{-1}$.

4. The cooling system according to claim 1, wherein the fluorine-based resin filter is made from PTFE, and the insulating coolant composition comprises mineral oil.

* * * * *